(12) United States Patent
Fan et al.

(10) Patent No.: US 11,217,559 B2
(45) Date of Patent: Jan. 4, 2022

(54) TRANSFER METHOD AND TRANSFER DEVICE OF MICRO LED

(71) Applicant: Shenzhen China Star Optoelectronics Semiconductor Display Technology Co., Ltd., Shenzhen (CN)

(72) Inventors: Yong Fan, Shenzhen (CN); Chiayu Lee, Shenzhen (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 268 days.

(21) Appl. No.: 16/625,819

(22) PCT Filed: Dec. 17, 2019

(86) PCT No.: PCT/CN2019/125918
§ 371 (c)(1),
(2) Date: Dec. 23, 2019

(87) PCT Pub. No.: WO2021/109238
PCT Pub. Date: Jun. 10, 2021

(65) Prior Publication Data
US 2021/0366870 A1    Nov. 25, 2021

(30) Foreign Application Priority Data

Dec. 3, 2019   (CN) .......................... 201911216985.0

(51) Int. Cl.
*H01L 25/16* (2006.01)
*H01L 23/00* (2006.01)
*H01L 21/67* (2006.01)
*H01L 25/13* (2006.01)
*H01L 21/66* (2006.01)

(52) U.S. Cl.
CPC ........ *H01L 24/95* (2013.01); *H01L 21/67144* (2013.01); *H01L 22/26* (2013.01); *H01L 25/13* (2013.01)

(58) Field of Classification Search
CPC .... H01L 25/041; H01L 25/042; H01L 25/167
See application file for complete search history.

(56) References Cited

U.S. PATENT DOCUMENTS

2017/0194304 A1\* 7/2017 Takeya ................. H01L 25/162

\* cited by examiner

*Primary Examiner* — Jae Lee
(74) *Attorney, Agent, or Firm* — Luedeka Neely Group, P.C.

(57) ABSTRACT

A transfer method and a transfer device of micro LEDs are provided. By horizontally and vertically stretching a tensile substrate evenly to make horizontal distances and vertical distances between the adjacent micro LEDs achieve predetermined target values, and at last, bonding the micro LEDs spaced apart into the target values to an array substrate. The method does not need to manufacture a patterned mold or a patterned transfer head, and production period is reduced, and production cost is lowered, which effectively improves current transfer methods of the micro LEDs.

20 Claims, 6 Drawing Sheets

TRANSFER METHOD AND TRANSFER DEVICE OF MICRO LED

FIELD OF INVENTION

The present disclosure relates to the field of display, and particularly relates to a transfer method and a transfer device of micro light emitting diodes (LEDs).

BACKGROUND OF INVENTION

Because micro light emitting diodes (LEDs) have characteristics, such as high reliability, high color gamuts, high brightness, high transparency, high pixels per inch (PPI), low encapsulation requirements, more easily to realize flexible, and seamless splicing, etc., which are displays having great development potential in future.

Transferring of current micro LEDs generally requires to manufacture a patterned mold or a patterned transfer heads. Manufacturing of the mold and manufacturing of the patterned transfer heads make production period lengthen and increase production cost, and products with different dimensions are required different to manufacture different molds or different patterned transfer heads, thereby making flexibility of manufacturing be lowered. How to omit patterned molds and patterned transfer heads during a transfer process of micro LEDs is a current direction of realizing rapid transfer with large areas.

Therefore, current micro LED transfer has defect, and it is needs to improve.

SUMMARY OF INVENTION

The present disclosure provides a transfer method and a transfer device of micro light emitting diodes (LEDs) to improve the defect exists in the current micro LED transfer.

In order to solve the problem mentioned above, the present disclosure provides technical solutions as follows:

The present disclosure provides a transfer method of micro LEDs, including:

Bonding a first temporary substrate to a first surface of the micro LEDs located on a base substrate.

Peeling off the base substrate.

Bonding a tensile substrate to a second surface of the micro LEDs.

Peeling off the first temporary substrate.

Stretching the tensile substrate horizontally and vertically to make distances between the adjacent micro LEDs achieve target values which are predetermined.

Bonding a second temporary substrate to the first surface of the micro LEDs.

Peeling off the tensile substrate.

Bonding a transfer substrate to the second surface of the micro LEDs.

Peeling off the second temporary substrate.

Guiding the micro LEDs to bond to an array substrate by the transfer substrate.

Peeling off the transfer substrate.

In the transfer method provided by the present disclosure, the specific step of stretching the tensile substrate horizontally and vertically to make the distances between the adjacent micro LEDs achieve the target values which are predetermined includes:

Stretching the tensile substrate horizontally and evenly and detecting horizontal distances between the micro LEDs.

Stretching the tensile substrate vertically and evenly and detecting vertical distances between the micro LEDs.

In the transfer method provided by the present disclosure, the specific step of stretching the tensile substrate horizontally and evenly and detecting horizontal distances between the micro LEDs includes:

Respectively applying even external forces away from a center of the tensile substrate on two opposite sides of the tensile substrate on a horizontal direction.

Detecting the horizontal distances between the adjacent micro LEDs by an automatic optical detector.

When the horizontal distances of the adjacent micro LEDs do not achieve the target values which are predetermined, continuously stretching the tensile substrate horizontally and evenly.

When the horizontal distances of the adjacent micro LEDs achieve the target values, stop stretching.

In the transfer method provided by the present disclosure, the specific step of stretching the tensile substrate vertically and evenly and detecting vertical distances between the micro LEDs includes:

Respectively applying even external forces away from a center of the tensile substrate on two opposite sides of the tensile substrate on a vertical direction.

Detecting the vertical distances between the adjacent micro LEDs by an automatic optical detector.

When the vertical distances of the adjacent micro LEDs do not achieve the target values, continuously stretching the tensile substrate vertically and evenly.

When the vertical distances of the adjacent micro LEDs achieve the target values, stop stretching.

In the transfer method provided by the present disclosure, the step of stretching the tensile substrate horizontally and vertically to make distances between the adjacent micro LEDs achieve the target values which are predetermined further includes:

Heating the tensile substrate in a tensile process.

In the transfer method provided by the present disclosure, a heating method includes wind heating or light heating.

In the transfer method provided by the present disclosure, the specific step of peeling off the base substrate further includes:

Peeling off a sapphire base substrate by a laser peeling off technology.

Peeling off a gallium arsenide base substrate by a chemical peeling off method.

In the transfer method provided by the present disclosure, the specific step of bonding the tensile substrate to the second surface of the micro LEDs includes:

Coating a layer of adhesive on a side of the tensile substrate contacted to the second surface of the micro LEDs.

Bonding the tensile substrate to the second surface of the micro LEDs.

Heating and curing the adhesive to make the tensile substrate bond with the second surface of the micro LEDs together.

In the transfer method provided by the present disclosure, the specific step of bonding a second temporary substrate to the first surface of the micro LEDs includes:

Bonding a surface of the second temporary substrate disposing with an adhesive layer to the first surface of the micro LEDs spaced apart into the target values.

In the transfer method provided by the present disclosure, the specific step of the transfer substrate guiding the micro LEDs to bond with the array substrate includes:

Guiding the micro LEDs spaced apart into the target values to align with the array substrate by the transfer substrate.

Bonding the micro LEDs to the array substrate.

Peeling off the transfer substrate by a laser peeling off technology.

Meanwhile, the present disclosure provides a transfer device of micro LEDs, including:

A first temporary substrate, which is used to temporarily carry the micro LEDs.

A substrate peeling off member, which is used to peel off a substrate bonding to the micro LEDs.

A tensile substrate, which is used to carry the micro LEDs, and the tensile substrate can be stretched horizontally and be stretched vertically.

A tensile member, which includes a horizontal clamping part and a vertical clamping part. The horizontal clamping part is used to clamp two opposite sides of the tensile substrate on a horizontal direction and applies even external forces away from a center of the tensile substrate on the two opposite sides, and the vertical clamping part is used to clamp two opposite sides of the tensile substrate on a vertical direction and applies even external forces away from the center of the tensile substrate on the two opposite sides.

A second temporary substrate, which is used to carry the micro LEDs.

A transfer substrate, which is used to transfer the micro LEDs to an array substrate.

In the transfer device provided by the present disclosure, a material of the tensile substrate is polymer material having tensile performance.

In the transfer device provided by the present disclosure, the tensile member further includes a heating part used to heat the tensile substrate during a tensile process.

In the transfer device provided by the present disclosure, the polymer material includes polydimethylsiloxane, polyethylene terephthalate, polycarbonate, or polyethylene terephthalate.

In the transfer device provided by the present disclosure, the tensile member further includes a distance detecting part used to detect distances between the adjacent micro LEDs during a tensile process.

In the transfer device provided by the present disclosure, the heating part includes an air heater or a light radiation machine.

In the transfer device provided by the present disclosure, the distance detecting part is an automatic optical detector.

In the transfer device provided by the present disclosure, the horizontal clamping part includes two horizontal substrate clamps and two horizontal substrate drivers which are disposed oppositely, and the vertical clamping part includes two vertical substrate clamps and two vertical substrate drivers which are disposed oppositely.

In the transfer device provided by the present disclosure, the first temporary substrate and the second temporary substrate include adhesive layers, and the adhesive layers are used to bond to the first surface of the micro LEDs.

In the transfer device provided by the present disclosure, the substrate peeling off member includes a laser peeling off part and a chemical peeling off part.

The present disclosure provides a transfer method and a transfer method of micro LEDs. The method includes: bonding a first temporary substrate to a first surface of the micro LEDs located on a base substrate, peeling off the base substrate, bonding a tensile substrate to a second surface of the micro LEDs, peeling off the first temporary substrate, stretching the tensile substrate horizontally and vertically to make distances between the adjacent micro LEDs achieve target values which are predetermined, bonding a second temporary substrate to the first surface of the micro LEDs, peeling off the tensile substrate, bonding a transfer substrate to the second surface of the micro LEDs, peeling off the second temporary substrate, guiding the micro LEDs to bond to an array substrate by the transfer substrate; and peeling off the transfer substrate. By transferring the micro LEDs disposed on the base substrate in an array manner to the tensile substrate, and then by horizontally and vertically stretching the tensile substrate evenly to make horizontal distances and vertical distances between the adjacent micro LEDs achieve target values which are predetermined, and at last by bonding the micro LEDs spaced apart into the target values to the array substrate, thereby the methods completing the transfer process of the micro LEDs. This method does not need to manufacture a patterned mold or a patterned transfer head, so that production period is reduced, and production cost is lowered. Meanwhile, using the tensile substrate to stretch to realize target intervals of the micro LEDs can satisfy requirements of different micro LED interval designs, and flexibility of manufacturing can be higher. This effectively improves current transfer methods of the micro LEDs.

DETAILED DESCRIPTION OF PREFERRED EMBODIMENTS

Figure 1:
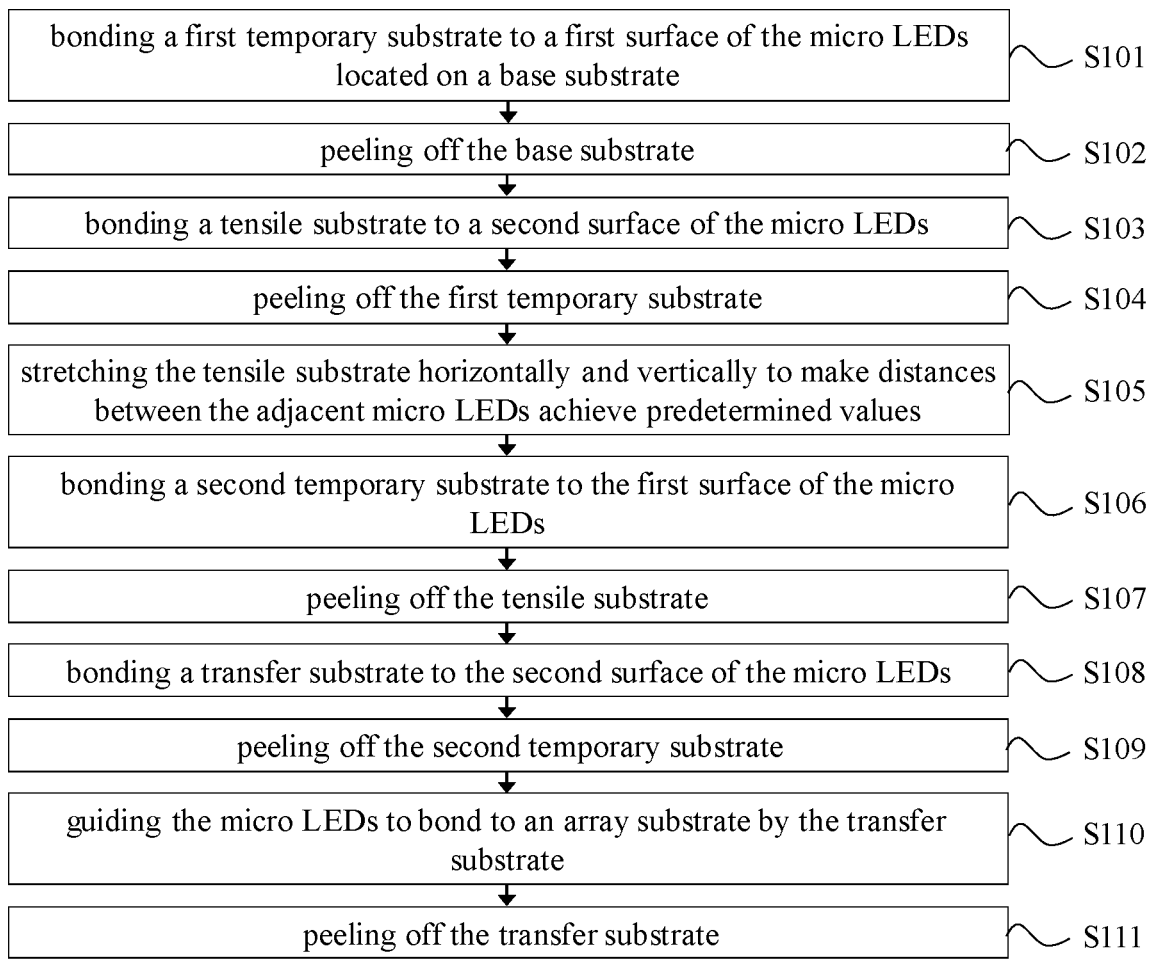
FIG. 1 is a flowchart of a transfer method of micro LEDs provided by an embodiment of the present disclosure.

The descriptions of embodiments below refer to accompanying drawings in order to illustrate certain embodiments which the present disclosure can implement. The directional terms of which the present disclosure mentions, for example, "top", "bottom", "upper", "lower", "front", "rear", "left", "right", "inside", "outside", "side", etc., only refer to directions of the accompanying figures. Therefore, the used directional terms are for illustrating and understanding the present disclosure, but not for limiting the present disclosure. In the figures, units with similar structures are indicated by the same reference numerals.

Aiming at the problem that micro light emitting diodes (LEDs) transfer has defect, the present disclosure provides a transfer method and a transfer device of micro LEDs can relieve this problem.

In an embodiment, as illustrated in FIG. 1, the transfer method of the micro LEDs provided by the present disclosure includes:

S101, bonding a first temporary substrate to a first surface of the micro LEDs located on a base substrate.

S102, peeling off the base substrate.

S103, bonding a tensile substrate to a second surface of the micro LEDs.

S104, peeling off the first temporary substrate.

S105, stretching the tensile substrate horizontally and vertically to make distances between the adjacent micro LEDs achieve target values which are predetermined.

S106, bonding a second temporary substrate to the first surface of the micro LEDs.

S107, peeling off the tensile substrate.

S108, bonding a transfer substrate to the second surface of the micro LEDs.

S109, peeling off the second temporary substrate.

S110, guiding the micro LEDs to bond to an array substrate by the transfer substrate.

S111, peeling off the transfer substrate.

This embodiment provides a transfer method of the micro LEDs. By transferring the micro LEDs disposed on the base substrate in an array manner to the tensile substrate, and then by horizontally and vertically stretching the tensile substrate evenly to make horizontal distances and vertical distances between the adjacent micro LEDs achieve target values which are predetermined, and at last by bonding the micro LEDs spaced apart into the target values to the array substrate, thereby the methods completing the transfer process of the micro LEDs. This method does not need to manufacture a patterned mold or a patterned transferring head, and production period is reduced, and production cost is lowered. Meanwhile, using the tensile substrate to stretch to realize target intervals of the micro LEDs can satisfy requirements of different micro LED interval designs, and flexibility of manufacturing can be higher. This effectively improves current transfer methods of the micro LEDs.

Figure 2A:
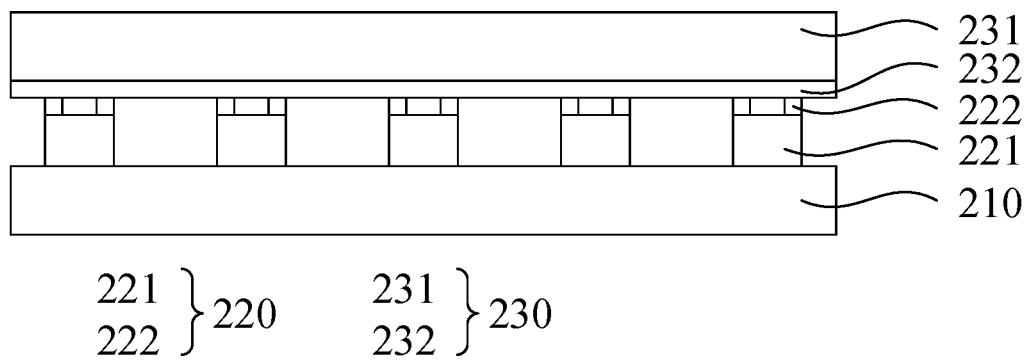
FIG. 2(a) to FIG. 2(k) are first structural schematic diagrams of the transfer method of the micro LEDs provided by an embodiment of the present disclosure.
Figure 2B:
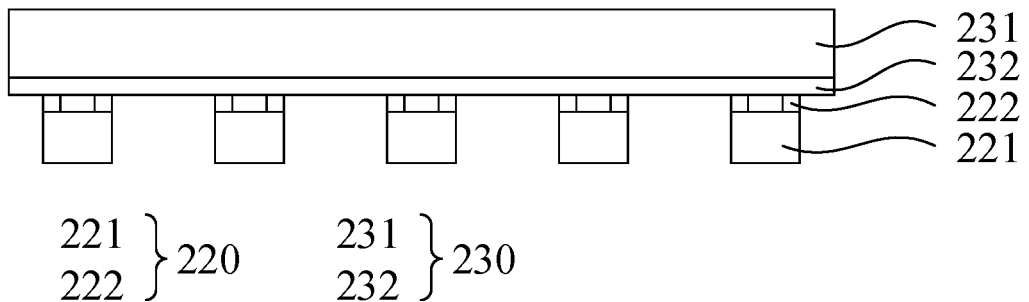
Figure 2C:
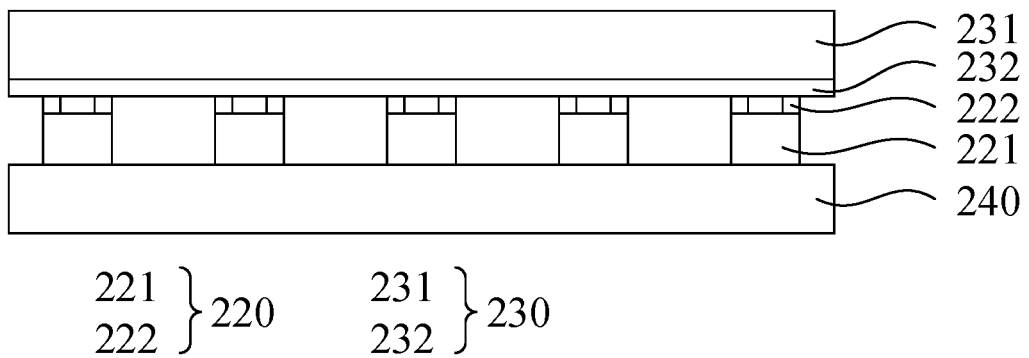
Figure 2D:
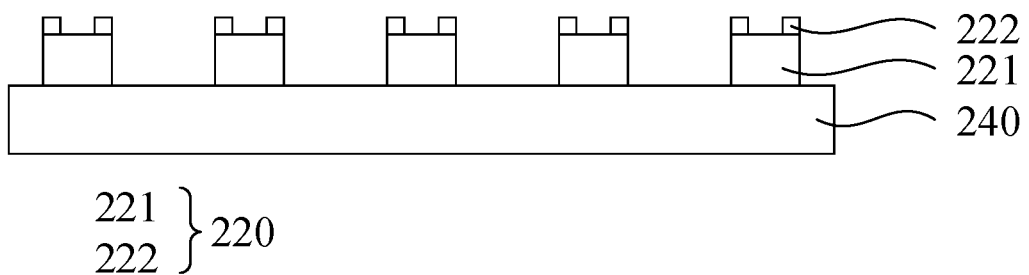
Figure 2E:
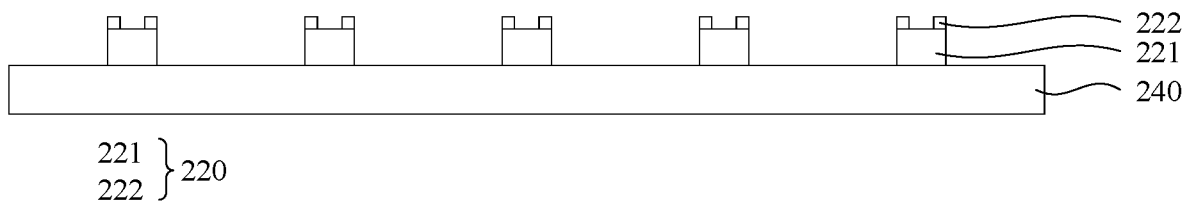
Figure 2F:
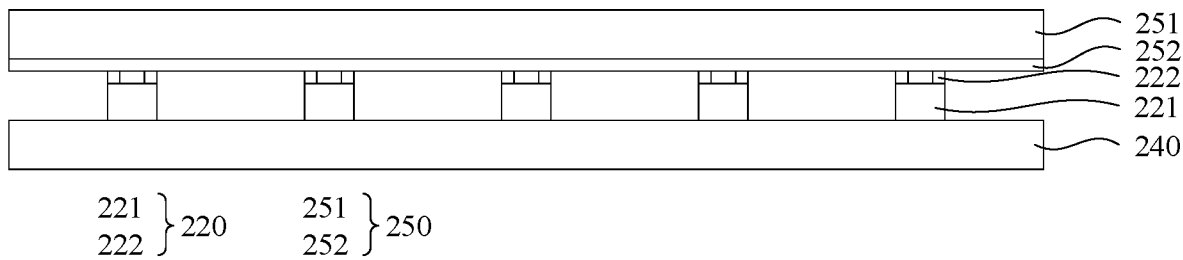
Figure 2G:
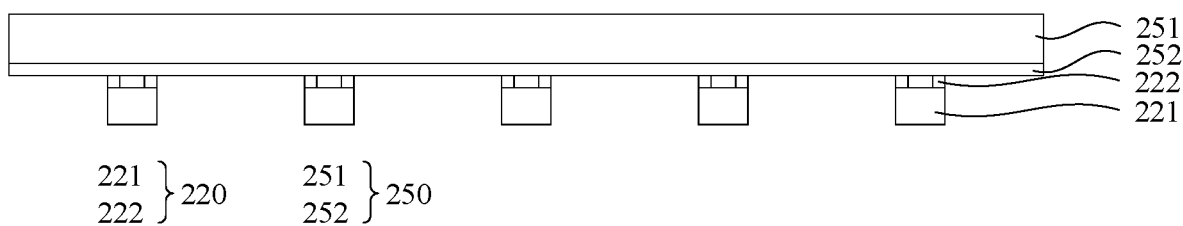
Figure 2H:
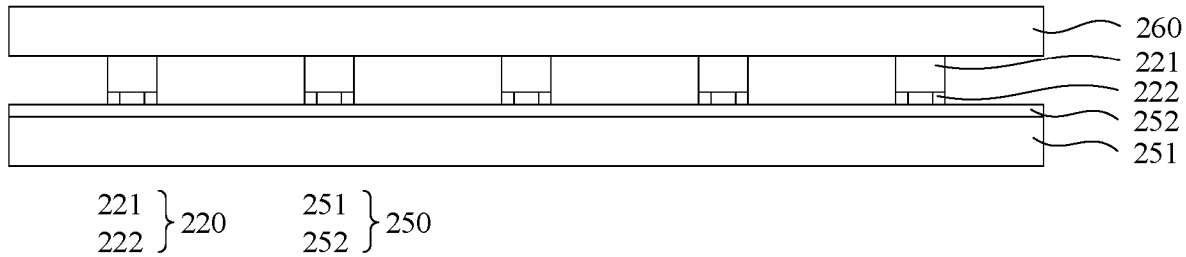
Figure 2I:
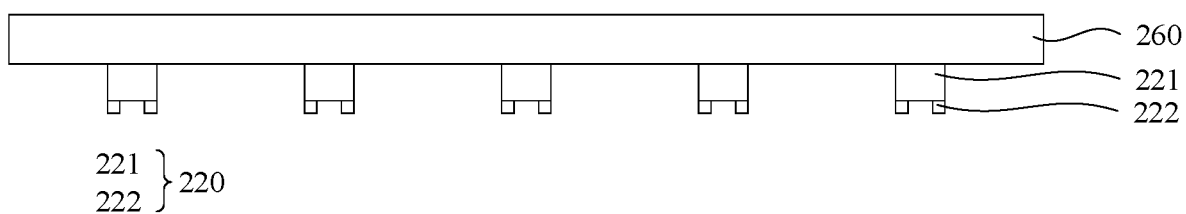
Figure 2J:
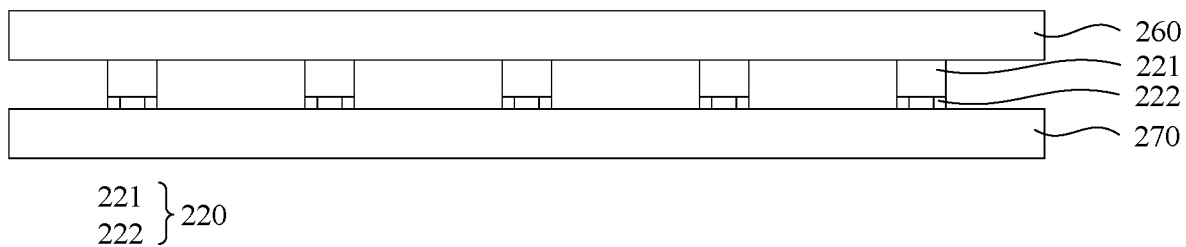
Figure 2K:
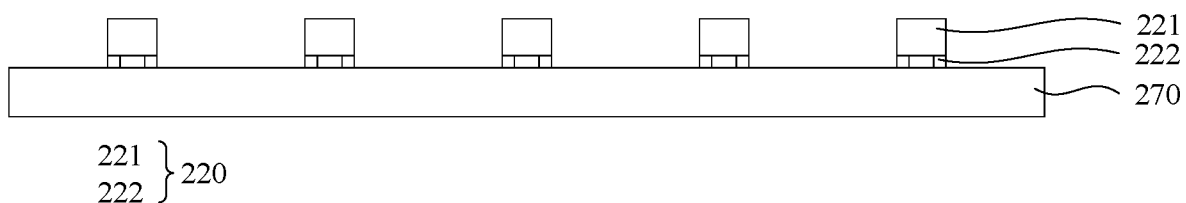
Figure 3A:
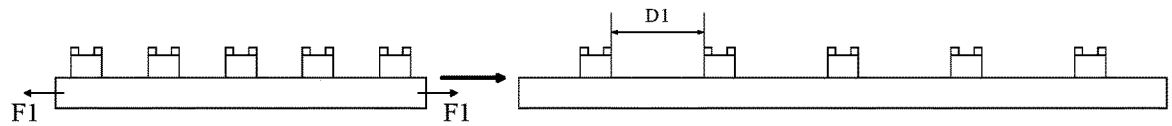
FIG. 3(a) to FIG. 3(c) are second structural schematic diagrams of the transfer method of the micro LEDs provided by an embodiment of the present disclosure.
Figure 3B:
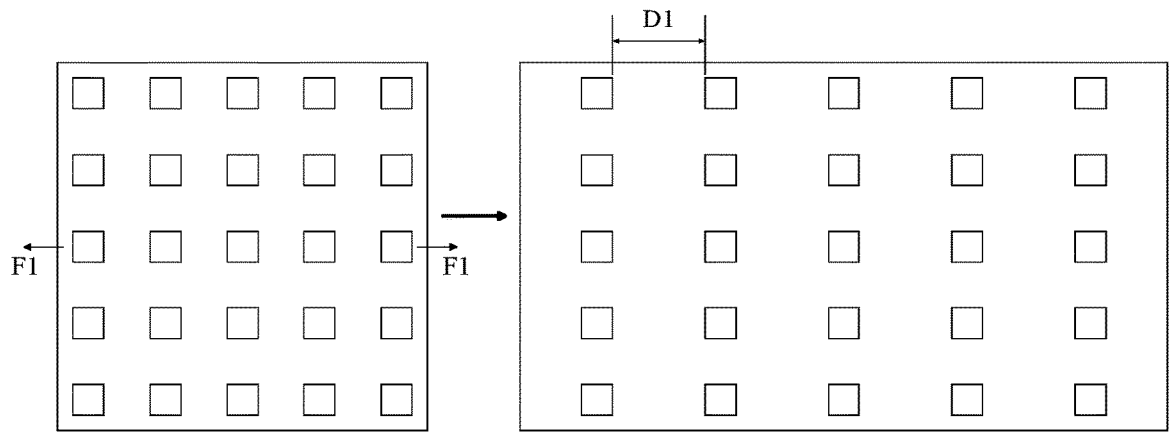
Figure 3C:
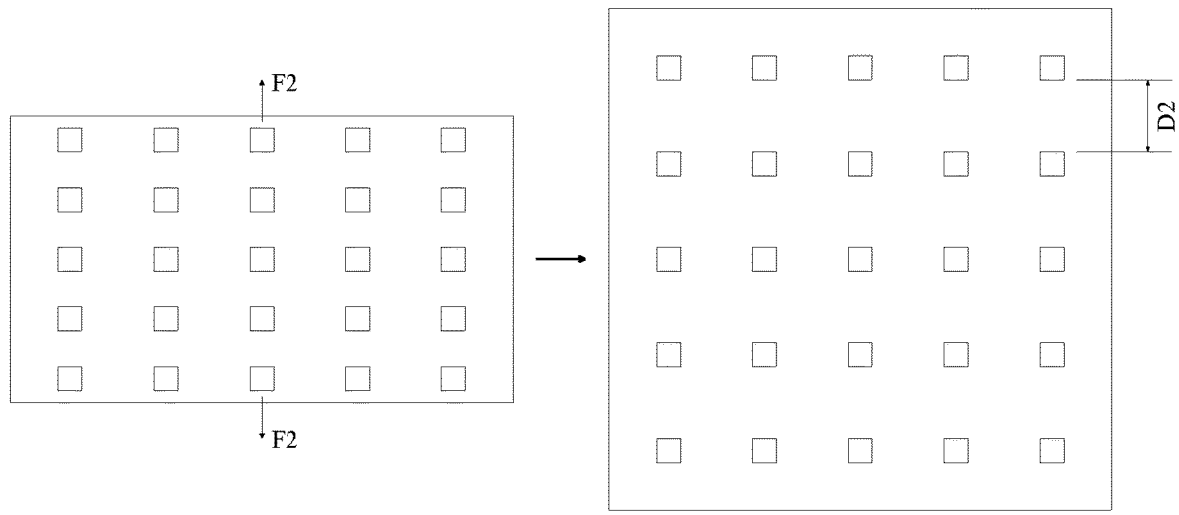

The transfer method of the micro LEDs provided by the present disclosure is further described in detail as follow with reference to the FIG. 2(a) to FIG. 3(c). Illustrated in FIG. 2(a) to FIG. 2(k) are schematic diagrams of the micro LED transfer provided by an embodiment of the present disclosure, and illustrated in FIG. 3(a) to FIG. 3(c) are decomposition schematic diagrams of the step S105 provided by an embodiment of the present disclosure.

In an embodiment, please refer to FIG. 2(a), in S101, bonding the first temporary substrate to the first surface of the micro LEDs located on the base substrate, which is specifically to bond a surface of the first temporary substrate disposing with an adhesive layer to the first surface of the micro LEDs.

The micro LEDs are formed on the base substrate. Green micro LEDs and blue micro LEDs are formed on a sapphire base substrate, and red micro LEDs are formed on a gallium arsenide (GaAs) base substrate. The micro LEDs are arranged in an array manner on the base substrate. The micro LEDs includes a gallium nitride (GaN) epitaxial layer, an N-type GaN layer (GaN:Si), a multiple quantum well (MQW) layer (composed by InGaN/GaN overlapped in multi-layers), a P-type GaN layer (GaN:Mg), an insulation layer ($SiO_2$), a current distribution layer (Ni/Au, ITO, graphene, etc.), a protective layer ($SiO_2$), N-type and P-type electrode layers (Cr/Pt/Au, Pt/Au, Ni/Au, etc.).

The micro LEDs include a first surface and a second surface. A surface away from the base substrate is the first surface, and the first surface is an electrode surface. A surface contacted to the base substrate is the second surface. Because the first temporary substrate is bonded to the first surface of the micro LEDs, and the adhesive layer is disposed on a side where the first temporary substrate is bonded to the first surface of the micro LEDs, the adhesive layer is used to fix the micro LEDs on the first temporary substrate, which prevents from the micro LEDs moving in the transfer process, and meanwhile planarizes and protects the first surface of the micro LEDs to avoid the electrode surface of the micro LEDs corrupting due to collision between the micro LEDs and the first temporary substrate.

In an embodiment, please refer to FIG. 2(b), the specific step of peeling off the base substrate in S102 includes:

Peeling off the sapphire base substrate by a laser peeling off technology. Specifically, a semiconductor laser device emits laser beam to irradiate the sapphire base substrate. When the laser beam irradiates the adhesive layer of the sapphire base substrate and the micro LEDs, a temperature of the adhesive layer is increased, and a laser ablation reaction occurs, and then the adhesive layer loses stickiness, thereby peeling off the sapphire base substrate being realized.

The GaAs base substrate is peeled off by a chemical peeling off method. Specifically, the used chemical agent, such as $NH_4OH$ or $H_2O_2$, can selectively corrode the GaAs base substrate. The GaAs base substrate can be removed by the chemical reaction, thereby achieving the purpose of peeling off the GaAs base substrate.

In an embodiment, please refer to FIG. 2(c), in the specific step S103 of bonding a tensile substrate to a second surface of the micro LEDs includes: coating a layer of adhesive on a side of the tensile substrate contacted to the second surface of the micro LEDs, bonding the tensile substrate to the second surface of the micro LEDs, and heating and curing the adhesive to make the tensile substrate bond with the second surface of the micro LEDs together.

Furthermore, a material of the tensile substrate is a polymer material having tensile performance, which includes polydimethylsiloxane (PDMS), polyethylene terephthalate (PET), polycarbonate (PC), or polyethylene terephthalate (PEN), etc.

In an embodiment, please refer to FIG. 2(d), the specific step S104 of peeling off the first temporary substrate is to peel off the first temporary substrate by a laser peeling off technology.

Specifically, the semiconductor laser device emits laser beam to irradiate the adhesive layer of the first temporary substrate. When the laser beam irradiates the adhesive layer, a temperature of the adhesive layer is increased, and the adhesive layer is heated and swells archly, making a contact area between the micro LEDs and the adhesive layer become small, and under gravity effect, the micro LEDs departs from the first temporary substrate, thereby peeling off the sapphire base substrate. A material of the first temporary substrate is a laser transparent material. The laser transparent material is conducive to the laser beam penetrating the first temporary substrate, irradiating the adhesive layer, and transmitting more heat to the adhesive layer.

In an embodiment, please refer to FIG. 2(e), the specific step S105 of stretching the tensile substrate horizontally and vertically to make distances between the adjacent micro LEDs achieve target values which are predetermined includes:

Stretching the tensile substrate horizontally and evenly and detecting horizontal distances between the micro LEDs. As illustrated in FIG. 3(a) and FIG. 3(b), FIG. 3(a) is a front view of stretching the tensile substrate horizontally and evenly, and FIG. 3(b) is a top view of stretching the tensile substrate horizontally and evenly. Specifically, respectively applying even external forces F1 away from a center of the tensile substrate on two opposite sides of the tensile substrate on a horizontal direction, and meanwhile detecting the horizontal distances D1 between the adjacent micro LEDs by an automatic optical detector. When the horizontal distances D1 of the adjacent micro LEDs do not achieve the predetermined horizontal target values, continuously stretching the tensile substrate horizontally and evenly. When the horizontal distances D1 of the adjacent micro LEDs achieve the horizontal target values, stop stretching.

The horizontal target values herein are interval values of each subpixel driving circuit used in subsequent processes on the horizontal direction.

Stretching the tensile substrate vertically and evenly and detecting vertical distances between the micro LEDs. Illustrated in FIG. 3(c) is a top view of stretching the tensile substrate vertically and evenly. Specifically, respectively applying even external forces F2 away from the center of the tensile substrate on two opposite sides of the tensile substrate on a vertical direction, and meanwhile, detecting the vertical distances D2 between the adjacent micro LEDs by the automatic optical detector. When the vertical distances D2 of the adjacent micro LEDs do not achieve the predetermined vertical target values, continuously stretching the tensile substrate vertically and evenly. When the vertical distances D2 of the adjacent micro LEDs achieve the vertically target values, stop stretching. The vertical target values herein are interval values of each subpixel driving circuit used in subsequent processes on the vertical direction.

So far, stretching of the tensile substrate on the horizontal direction and the vertical direction is completed. By stretching the tensile substrate, the micro LED located on the tensile substrate is guided, and spatial translation occurs, which makes horizontal distances and vertical distances between the adjacent micro LEDs respectively achieve the predetermined target values, and this provides foundation of the subsequent bonding of the micro LEDs and the array substrate. Moreover, this configuration manner of arranging the micro LEDs with intervals can satisfy arbitrary predetermined target values of intervals on the horizontal directions and vertical directions, and which flexibility of manufacturing is high. Meanwhile, in the process of resetting the distances between the micro LEDs, there are no need to use a patterned mold or a patterned transfer head, which reduces production period and lowers production cost.

In the process of stretching the tensile substrate horizontally and vertically, the tensile substrate can be heated at a certain extent, which makes the tensile process of the tensile substrate be easier, and makes stretching of the tensile substrate be more evenly. Because the material of the tensile substrate is polymer material having tensile performance, and a general polymer material has a characteristic of becoming soft and flexible after heated. When stretching the tensile substrate, heating the tensile substrate under a certain temperature, which makes soft fluidity of the tensile substrate be improved, and makes hardness of the tensile substrate be lowered, reducing the force used for stretching, and meanwhile, can prevent corruption of the tensile substrate in the tensile process, and conducive to smoothly executing the tensile process.

In another embodiment, when stretching the tensile substrate horizontally or vertically, heating the entire tensile substrate uniformly. Heating the entire tensile substrate uniformly makes each part of the entire tensile substrate can be softened, and under the situation of applying two even external forces on the two opposite sides of the substrate, which is conducive to stretching the entire substrate.

In another embodiment, when stretching the tensile substrate horizontally or vertically, heating the tensile substrate on the horizontal direction or the vertical direction by a manner that the heat is decreased from the middle of the tensile substrate to the two sides of the tensile substrate. Because the tensile substrate has a certain dimension on the horizontal direction or the vertical direction, when applying two external forces on the two opposite sides of the tensile substrate on the horizontal direction or the vertical direction, a position closer to the middle of the substrate, the more difficult it is to be stretched and deforms. Heating the tensile substrate on the horizontal direction or the vertical direction by the manner that the heat is decreased from the middle of the tensile substrate to the two sides of the tensile substrate, making softness of the tensile substrate increase from the two sides of the tensile substrate to the middle of the tensile substrate on the horizontal direction or the vertical direction, thereby compensating the problem of stretching difficulty increment from the two sides of the tensile substrate to the middle of the tensile substrate, which is conducive to evenly stretching the entire tensile substrate.

In this embodiment, the heating method for the tensile substrate may be wind heating or may be light heating, and may also be other heating method, and it is not limited herein.

In an embodiment, please refer to FIG. 2(f), in S106, bonding the second temporary substrate to the first surface of the micro LEDs, which is specifically to bond a surface of the second temporary substrate disposing with an adhesive layer to the first surface of the micro LEDs spaced apart into the target values. Its specific principle is as same as the step S101 of bonding the surface of the first temporary substrate disposing with the adhesive layer to the first surface of the micro LEDs, and which can refer to the embodiment mentioned above, and will not give unnecessary details herein.

In an embodiment, please refer to FIG. 2(g), the specific step S107 of peeling off the tensile substrate is to peel off the tensile substrate by the laser peeling off technology. Its specific principle is as same as peeling off the sapphire base substrate by the laser peeling off technology, and which can refer to the embodiment mentioned above, and will not give unnecessary details herein.

In an embodiment, please refer to FIG. 2(h), the specific step S108 of bonding the transfer substrate to the second surface of the micro LEDs includes: coating a layer of adhesive on a side of the tensile substrate contacted to the second surface of the micro LEDs, bonding the transfer substrate to the second surface of the micro LEDs spaced apart into the target values, and heating and curing the adhesive to make the tensile substrate bond with the second surface of the micro LEDs spaced apart into the target values together.

In an embodiment, please refer to FIG. 2(i), the specific step S109 of peeling off the second temporary substrate includes: peeling off the second temporary substrate by the laser peeling off technology. Its specific peeling off principle is as same as peeling off the sapphire base substrate by the laser peeling off technology, and which can refer to the embodiment mentioned above, and will not give unnecessary details herein.

In an embodiment, please refer to FIG. 2(j), the specific step S110 of guiding the micro LEDs to bond to the array substrate by the transfer substrate includes:

Guiding the micro LEDs spaced apart into the target values to align with the array substrate by the transfer substrate. Specifically, moving the transfer substrate to make each of the micro LEDs located on the transfer substrate align with each of the subpixel driving circuit of the array substrate one by one, and the first surface of the micro LEDs are aligned toward the pixel driving circuit layer of the array substrate.

Bonding the first surface of the micro LEDs to the array substrate. The specific bonding method may use a thermosonic method, a thermocompression bonding method, or other bonding method, and it is not limited herein.

In an embodiment, please refer to FIG. 2(K), the specific step S111 of peeling off the transfer substrate includes: peeling off the transfer substrate by the laser peeling off technology. Its specific peeling off principle is as same as peeling off the sapphire base substrate by the laser peeling off technology, and which can refer to the embodiment mentioned above, and will not give unnecessary details herein.

Figure 4:
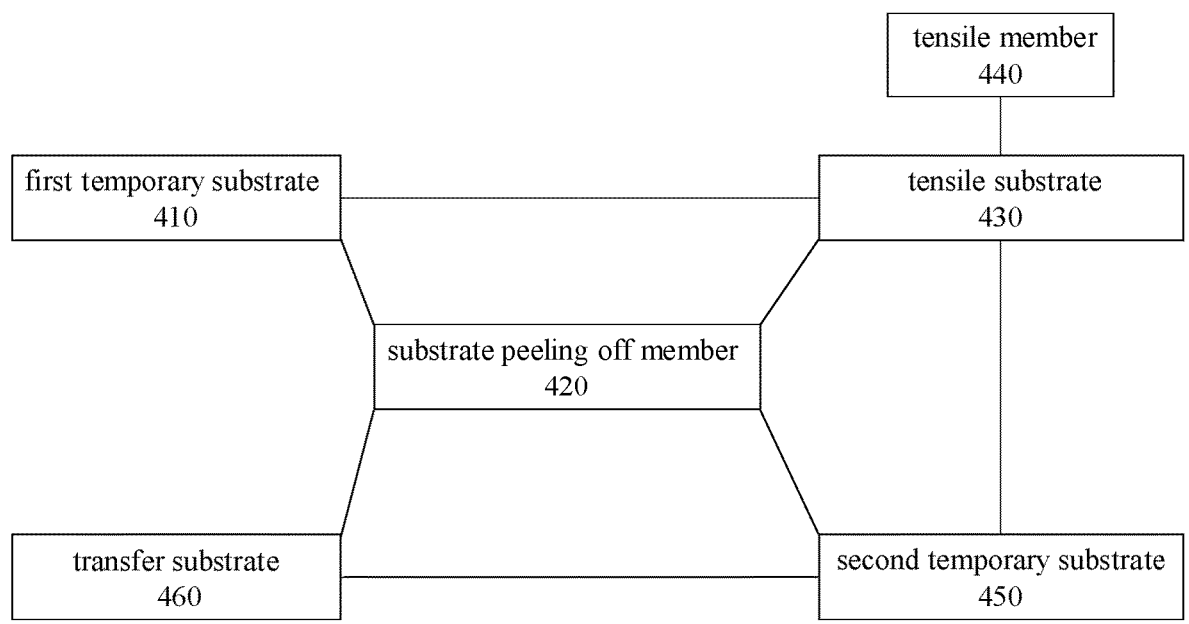
FIG. 4 is a structural block diagram of a transfer device of the micro LEDs provided by an embodiment of the present disclosure.

Meanwhile, the present disclosure provides a transfer device of the micro LEDs, and illustrated in FIG. 4 is a structural block diagram of the transfer device of the micro LEDs provided by an embodiment of the present disclosure, and the transfer device includes:

A first temporary substrate 410, which is used to temporarily carry the micro LEDs.

A substrate peeling off member 420, which is used to peel off a substrate bonding to the micro LEDs.

A tensile substrate 430, which is used to carry the micro LEDs, and the tensile substrate 430 can be stretched horizontally and be stretched vertically.

A tensile member 440, which includes a horizontal clamping part and a vertical clamping part. The horizontal clamping part is used to clamp two opposite sides of the tensile substrate on a horizontal direction and applies even external forces away from a center of the tensile substrate on the two opposite sides. The vertical clamping part is used to clamp two opposite sides of the tensile substrate on a vertical direction and applies even external forces away from the center of the tensile substrate on the two opposite sides.

A second temporary substrate 450, which is used to carry the micro LEDs.

A transfer substrate 460, which is used to transfer the micro LEDs to an array substrate.

This embodiment provides a transfer device of the micro LEDs. The device transfers the micro LEDs located on the base substrate to the tensile substrate by the first temporary substrate, and then stretches the tensile substrate horizontally and vertically by the tensile member, and by the stretching effect of the tensile substrate, the micro LEDs is guided, and spatial translation occurs, which makes the horizontal intervals and the vertical intervals of the micro LEDs achieve the predetermined target values, after that makes the micro LEDs spaced apart into the target values transfer to the array substrate by the second temporary substrate and the transfer substrate, at last, bonds the micro LEDs spaced apart into the target values to the array substrate, thereby completing the transfer process of the micro LEDs. The transfer device does not include a patterned mold or a patterned transfer head, so that production cost is lowered and manufacturing period is reduced. Meanwhile, the stretching effect of the tensile member to the tensile substrate is controllable, which can satisfy stretching of arbitrary target intervals of the micro LEDs, and flexibility of manufacturing can be higher. This effectively improves current transfer of the micro LEDs.

In an embodiment, material of the tensile substrate 403 is a polymer material having tensile performance, such as polydimethylsiloxane (PDMS), polyethylene terephthalate (PET), polycarbonate (PC), or polyethylene terephthalate (PEN), etc.

In an embodiment, the horizontal clamping part includes two horizontal substrate clamps and two horizontal substrate drivers which are disposed oppositely. The horizontal substrate clamps include a top splint and a bottom splint, and lengths of the top splint and the bottom splint are same and are longer than a vertical length of the tensile substrate. The horizontal substrate drivers are used to drive the two horizontal substrate clamps to execute an uniform motion toward a direction that away from the tensile substrate. The vertical clamping part includes two vertical substrate clamps and two vertical substrate drivers which are disposed oppositely. The vertical substrate clamps also include a top splint and a bottom splint, and lengths of the top splint and the bottom splint are same and are longer than a horizontal length of the tensile substrate. The vertical substrate drivers are used to drive the two vertical substrate clamps to execute an uniform motion toward the direction that away from the tensile substrate.

In an embodiment, the tensile member 440 further includes a distance detecting part used to detect the distances between the adjacent micro LEDs during the tensile process. When the horizontal distances and/or the vertical distances between the adjacent micro LEDs do not achieve the target values, continuously driving the tensile member to horizontally and/or vertically stretch the tensile substrate evenly. When the horizontal distances and/or the vertical distances of the adjacent micro LEDs achieve the target values, stop stretching. The distance detecting part is an automatic optical detector.

In an embodiment, the tensile member 440 further includes a heating part used to heat the tensile substrate during the tensile process. The heating part may be a uniformly heating type, or may be an adjustable heating type, for example, performing the heating method of decreasing the heat from a middle position of the substrate to the two stretched sides on the tensile substrate. The heating part may be an air heater, a light radiation machine, or other heating devices.

In an embodiment, the first temporary substrate 410 and the second temporary substrate 450 include adhesive layers. The adhesive layers are used to bond to the electrode surface of the micro LEDs to fix the micro LEDs and prevents from the micro LEDs moving in the transfer process, and meanwhile planarizes and protects the first surface of the micro LEDs to avoid the electrode surface of the micro LEDs corrupting due to collision between the micro LEDs and the first temporary substrate.

In an embodiment, the substrate peeling off member 420 includes a laser peeling off part and a chemical peeling off part. The laser peeling off part is used to peel off the sapphire base substrate, the first temporary substrate, the tensile substrate, and the second temporary substrate from the micro LEDs. The chemical peeling off part is used to peel off the GaAs base substrate from the micro LEDs.

According to embodiments mentioned above:

The embodiments of the present disclosure provide a transfer method and a transfer device of micro LEDs. The method includes: bonding a first temporary substrate to a first surface of the micro LEDs located on a base substrate, peeling off the base substrate, bonding a tensile substrate to a second surface of the micro LEDs, peeling off the first temporary substrate, stretching the tensile substrate horizontally and vertically to make distances between the adjacent micro LEDs achieve target values which are predetermined, bonding a second temporary substrate to the first surface of the micro LEDs, peeling off the tensile substrate, bonding a transfer substrate to the second surface of the micro LEDs, peeling off the second temporary substrate, guiding the micro LEDs to bond to an array substrate by the transfer substrate; and peeling off the transfer substrate. By transferring the micro LEDs disposed on the base substrate in an array manner to the tensile substrate, and then by horizontally and vertically stretching the tensile substrate evenly to make horizontal distances and vertical distances between the adjacent micro LEDs achieve target values which are predetermined, and at last by bonding the micro LEDs spaced apart into the target values to the array substrate, thereby the methods completing the transfer process of the micro LEDs. This method does not need to manufacture a patterned mold or a patterned transferring head, and production period is reduced, and production cost is lowered. Meanwhile, using the tensile substrate to stretch to realize target intervals of the micro LEDs can satisfy requirements of different micro LED interval designs, and flexibility of manufacturing can be higher. This effectively improves current transfer methods of the micro LEDs.

In summary, although the present disclosure has disclosed the preferred embodiments as above, however the above-mentioned preferred embodiments are not to limit to the present disclosure. A person skilled in the art can make any change and modification, therefore the scope of protection of the present disclosure is subject to the scope defined by the claims.

What is claimed is:

1. A transfer method of micro light emitting diodes (LEDs), comprising:
    bonding a first temporary substrate to a first surface of the micro LEDs located on a base substrate;
    peeling off the base substrate;
    bonding a tensile substrate to a second surface of the micro LEDs;
    peeling off the first temporary substrate;
    stretching the tensile substrate horizontally and vertically to make distances between the adjacent micro LEDs achieve target values which are predetermined;
    bonding a second temporary substrate to the first surface of the micro LEDs;
    peeling off the tensile substrate;
    bonding a transfer substrate to the second surface of the micro LEDs;
    peeling off the second temporary substrate;
    guiding the micro LEDs to bond to an array substrate by the transfer substrate; and
    peeling off the transfer substrate.

2. The transfer method as claimed in claim 1, wherein the step of stretching the tensile substrate horizontally and vertically to make the distances between the adjacent micro LEDs achieve the target values which are predetermined comprises:
    stretching the tensile substrate horizontally and evenly and detecting horizontal distances between the micro LEDs; and
    stretching the tensile substrate vertically and evenly and detecting vertical distances between the micro LEDs.

3. The transfer method as claimed in claim 2, wherein the step of stretching the tensile substrate horizontally and evenly and detecting horizontal distances between the micro LEDs comprises:
    respectively applying even external forces away from a center of the tensile substrate on two opposite sides of the tensile substrate on a horizontal direction;
    detecting the horizontal distances between the adjacent micro LEDs by an automatic optical detector;
    when the horizontal distances of the adjacent micro LEDs do not achieve the predetermined target values, continuously stretching the tensile substrate horizontally and evenly;
    when the horizontal distances of the adjacent micro LEDs achieve the target values, stop stretching.

4. The transfer method as claimed in claim 2, wherein the step of stretching the tensile substrate vertically and evenly and detecting vertical distances between the micro LEDs comprises:
    respectively applying even external forces away from a center of the tensile substrate on two opposite sides of the tensile substrate on a vertical direction;
    detecting the vertical distances between the adjacent micro LEDs by an automatic optical detector;
    when the vertical distances of the adjacent micro LEDs do not achieve the predetermined target values, continuously stretching the tensile substrate vertically and evenly;
    when the vertical distances of the adjacent micro LEDs achieve the target values, stop stretching.

5. The transfer method as claimed in claim 2, wherein the step of stretching the tensile substrate horizontally and vertically to make distances between the adjacent micro LEDs achieve the target values which are predetermined comprises:
    heating the tensile substrate in a tensile process.

6. The transfer method as claimed in claim 5, wherein a heating method comprises wind heating or light heating.

7. The transfer method as claimed in claim 1, wherein the step of peeling off the base substrate comprises:
    peeling off a sapphire base substrate by a laser peeling off technology; and
    peeling off a gallium arsenide base substrate by a chemical peeling off method.

8. The transfer method as claimed in claim 1, wherein the step of bonding the tensile substrate to the second surface of the micro LEDs comprises:
    coating a layer of adhesive on a side of the tensile substrate contacted to the second surface of the micro LEDs;
    bonding the tensile substrate to the second surface of the micro LEDs; and
    heating and curing the adhesive to make the tensile substrate bond with the second surface of the micro LEDs together.

9. The transfer method as claimed in claim 1, wherein the step of bonding a second temporary substrate to the first surface of the micro LEDs comprises:
    bonding a surface of the second temporary substrate disposing with an adhesive layer to the first surface of the micro LEDs spaced apart into the target values.

10. The transfer method as claimed in claim 1, wherein the step of guiding the micro LEDs to bond to the array substrate by the transfer substrate comprises:
    guiding the micro LEDs spaced apart into the target values to align with the array substrate by the transfer substrate;
    bonding the micro LEDs to the array substrate; and
    peeling off the transfer substrate by a laser peeling off technology.

11. A transfer device of micro light emitting diodes (LEDs), comprising:
    a first temporary substrate used to temporarily carry the micro LEDs;
    a substrate peeling off member used to peel off a substrate bonding to the micro LEDs;
    a tensile substrate used to carry the micro LEDs, wherein the tensile substrate can be stretched horizontally and be stretched vertically;
    a tensile member comprising a horizontal clamping part and a vertical clamping part, wherein the horizontal clamping part is used to clamp two opposite sides of the tensile substrate on a horizontal direction and applies even external forces away from a center of the tensile substrate on the two opposite sides, and the vertical clamping part is used to clamp two opposite sides of the tensile substrate on a vertical direction and applies even external forces away from the center of the tensile substrate on the two opposite sides;

a second temporary substrate used to carry the micro LEDs; and a transfer substrate used to transfer the micro LEDs to an array substrate.

12. The transfer device as claimed in claim 11, wherein a material of the tensile substrate is a polymer material having tensile performance.

13. The transfer device as claimed in claim 12, wherein the polymer material comprises polydimethylsiloxane, polyethylene terephthalate, polycarbonate, or polyethylene terephthalate.

14. The transfer device as claimed in claim 11, wherein the tensile member comprises a heating part used to heat the tensile substrate during a tensile process.

15. The transfer device as claimed in claim 14, wherein the heating part comprises an air heater or a light radiation machine.

16. The transfer device as claimed in claim 11, wherein the tensile member comprises a distance detecting part used to detect distances between the adjacent micro LEDs during a tensile process.

17. The transfer device as claimed in claim 16, wherein the distance detecting part is an automatic optical detector.

18. The transfer device as claimed in claim 11, wherein the horizontal clamping part comprises two horizontal substrate clamps and two horizontal substrate drivers which are disposed oppositely, and the vertical clamping part comprises two vertical substrate clamps and two vertical substrate drivers which are disposed oppositely.

19. The transfer device as claimed in claim 11, wherein the first temporary substrate and the second temporary substrate comprise adhesive layers, and the adhesive layers are used to bond to the first surface of the micro LEDs.

20. The transfer device as claimed in claim 11, wherein the substrate peeling off member comprises a laser peeling off part and a chemical peeling off part.

* * * * *